United States Patent

Bussinger

(10) Patent No.: US 6,538,450 B2
(45) Date of Patent: Mar. 25, 2003

(54) METHOD AND DEVICE FOR LOCATING AN INSULATION FAULT IN AN ELECTRIC CABLE

(75) Inventor: Jean Bussinger, Sainte Anastasie (FR)

(73) Assignee: Socrat, Sollies-Pont (FR)

( * ) Notice: Subject to any disclaimer, the term of this patent is extended or adjusted under 35 U.S.C. 154(b) by 0 days.

(21) Appl. No.: 09/822,306

(22) Filed: Mar. 28, 2001

(65) Prior Publication Data

US 2002/0024342 A1 Feb. 28, 2002

Related U.S. Application Data

(63) Continuation of application No. PCT/FR99/02288, filed on Sep. 27, 1999.

(30) Foreign Application Priority Data

Sep. 28, 1998 (FR) .............................................. 98 12420

(51) Int. Cl.$^7$ ........................ G01R 31/08; H01H 31/12
(52) U.S. Cl. ........................ 324/523; 324/522; 324/526; 324/551; 324/516
(58) Field of Search ................................. 324/523, 522, 324/526, 551, 516

(56) References Cited

U.S. PATENT DOCUMENTS

| | | | | |
|---|---|---|---|---|
| 1,958,361 A | * | 5/1934 | Estes et al. | 324/526 |
| 2,120,391 A | * | 6/1938 | Butterfield | 324/526 |
| 3,358,226 A | * | 12/1967 | Clinton | 324/526 |
| 3,991,364 A | * | 11/1976 | Wiznerowicz | 324/533 |
| 4,446,421 A | | 5/1984 | Berde | 324/523 |
| 4,546,309 A | * | 10/1985 | Kang et al. | 324/529 |
| 4,559,491 A | * | 12/1985 | Saha | 324/522 |
| 4,896,114 A | * | 1/1990 | Donner | 324/522 |
| 4,922,183 A | * | 5/1990 | Kamas | 324/522 |
| 4,929,900 A | * | 5/1990 | Hastings et al. | 324/525 |
| 4,947,469 A | * | 8/1990 | Vokey et al. | 324/523 |
| 5,015,958 A | * | 5/1991 | Masia et al. | 324/522 |
| 5,132,629 A | * | 7/1992 | Clinton et al. | 324/554 |
| 5,235,286 A | * | 8/1993 | Masia et al. | 324/522 |
| 5,260,664 A | * | 11/1993 | Graham | 324/522 |
| 5,347,225 A | * | 9/1994 | Graham | 324/523 |
| 5,461,318 A | * | 10/1995 | Borchert et al. | 324/533 |
| 5,610,530 A | * | 3/1997 | Whetsel | 324/763 |
| 5,612,624 A | * | 3/1997 | Clinton | 324/551 |
| 5,708,364 A | * | 1/1998 | Vokey et al. | 324/523 |
| 5,844,199 A | * | 12/1998 | Iino et al. | 219/121.67 |
| 5,990,686 A | * | 11/1999 | Vokey et al. | 324/523 |

FOREIGN PATENT DOCUMENTS

| | | | |
|---|---|---|---|
| EP | 0 327 191 | 8/1989 | |
| EP | 548817 A2 | * 12/1992 | ........... G01R/31/08 |
| JP | 6281691 | * 7/1994 | ........... G01R/31/12 |

OTHER PUBLICATIONS

*Fehlerortung In Kabelnetzen Radio Fernsehen Elektronik*, vol. 43, No. 11, Nov. 1994, pp. 44/45.

*Computerized Underground Cable Fault Location Expertise*, Proceedings of the Power Engineering Society Transmission and Distribution Conference, Chicago, Apr. 1994, pp. 376–382.

* cited by examiner

*Primary Examiner*—N. Le
*Assistant Examiner*—Wasseem H. Hamdan
(74) *Attorney, Agent, or Firm*—Patterson, Thuente, Skaar & Christensen LLC

(57) ABSTRACT

Method for locating an insulation fault (Rd) in the screen (SCR) of a cable relative to the ground, the screen being electrically accessible at least at one point of origin (Po) and at one terminal point (Pe). A current is injected between the point of origin (Po) and the terminal point (Pe) of the screen (SCR), by a current or voltage generator (21) that is insulated from the ground, a first electric voltage (U1) is measured at the point of origin (Po), in reference to the ground, and a second electric voltage (U, U2) is measured at the terminal point (Pe). The ratio between the first (U1) and the second (U, U2) voltages measured is representative of the relative position (Pdr) of the insulation fault between the point of origin (Po) and the terminal point (Pe).

16 Claims, 6 Drawing Sheets

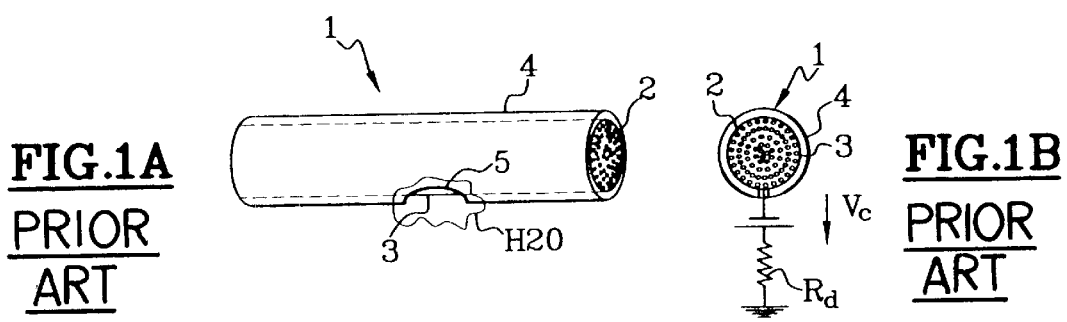
FIG.1A PRIOR ART
FIG.1B PRIOR ART
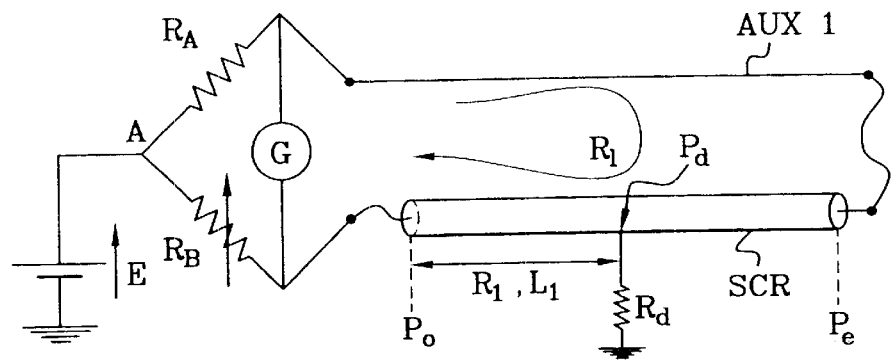
FIG.2 PRIOR ART
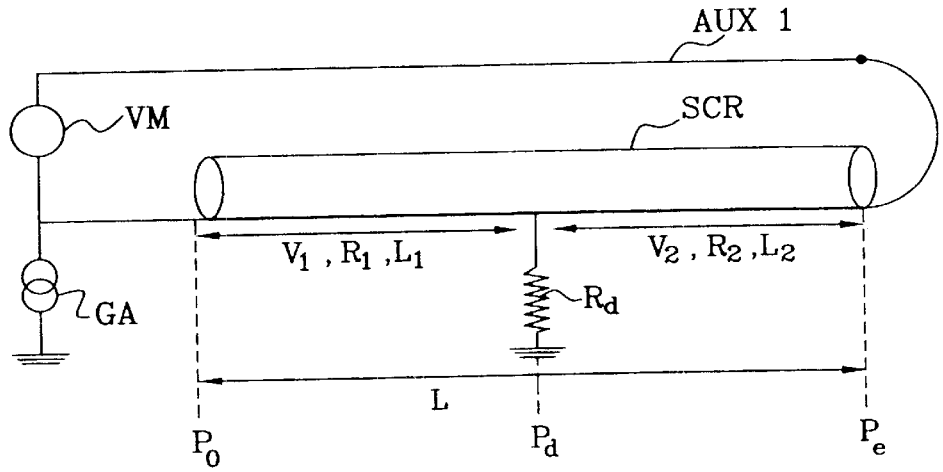
FIG.3 PRIOR ART

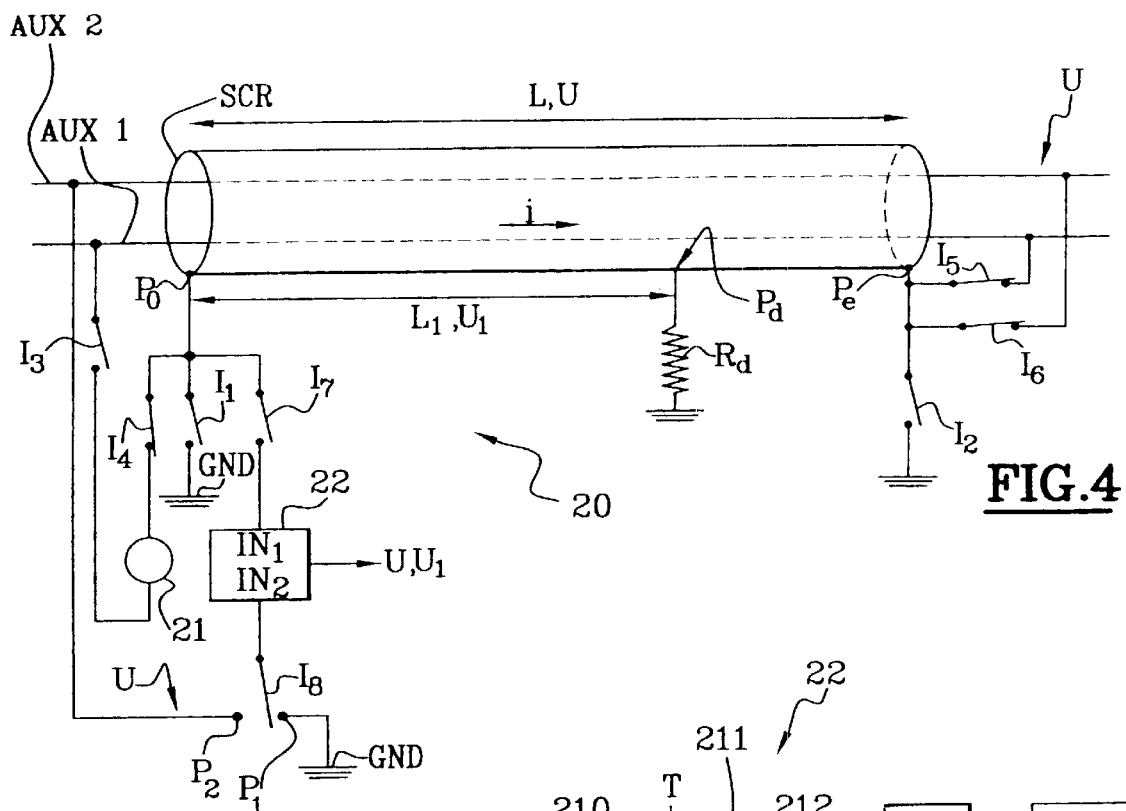
FIG.4
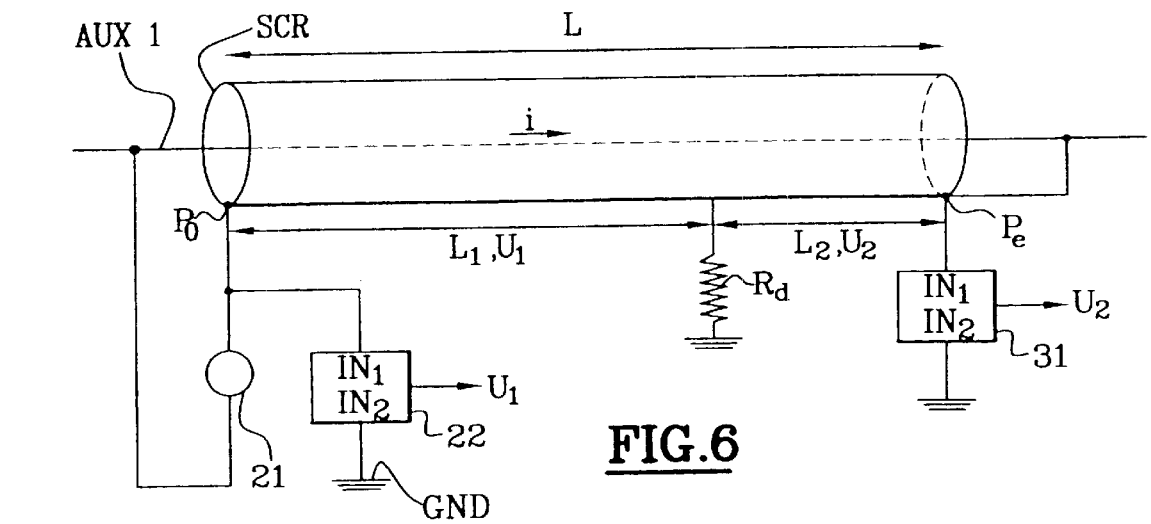
FIG.5
FIG.6

METHOD AND DEVICE FOR LOCATING AN INSULATION FAULT IN AN ELECTRIC CABLE

This is a continuation of International Application PCT/FR99/02288, with an international filing date of Sep. 27, 1999.

BACKGROUND OF THE INVENTION

1. Field of the Invention

The present invention relates to the locating of an insulation fault in an electric cable.

More particularly, the present invention relates to a method and a system for locating an insulation fault, relative to the ground, in the metallic sheath of a telecommunication cable.

Current tree structure telecommunication networks, are made using cables 1 of a high section of the type represented in FIG. 1A, comprising several hundred or even several thousand electric wires 2 insulated from each other by a suitable taping and arranged in twos to form "telephone pairs". The assembly is protected from electric disturbances by a metallic sheath, or screen 3. The screen 3 is itself covered by a protective sheath 4 made of an electrically insulating material such as polyethylene, PVC, . . .

These telecommunications cables, arranged in the ground, in the air, or immersed, are subject to various types of aggression, the most frequent of which are caused by lightning, rodents, road works, hunting, the friction of tree branches. As seen in FIG. 1A, these various aggressions can lead to a tear 5 in the protective sheath and to the penetration of water in the cable. From an electrical point of view, such deterioration leads to an insulation fault of the screen 3 relative to the ground, represented in FIG. 1B by a resistance Rd, and leads to the occurrence of a voltage Vc, or "electrochemical couple", particularly generated by the combination of the metal of the screen 3 with the water and various metal oxides. When a fault in water tightness is not repaired in time, the deterioration of the cable extends to the taping of the electric wires and develops over a substantial length of the cable due to the spread of water.

Checking the cables is therefore a major concern of telecommunications operators and more and more needs to be automated with a view to reducing maintenance costs and repair action times on site.

As telecommunication cables are of non-negligible lengths ranging from approximately one hundred meters to a few kilometers, the detection of an insulation fault must be followed by a step of locating the fault in order for qualified staff to operate on it.

Various methods for locating insulation faults between conductors are known of, some of which are applicable to the detection of an insulation fault between a conductor and the ground. Out of these methods, the most widespread are measuring bridge methods and the voltage drop method.

FIG. 2 illustrates a classical measuring bridge method. The measuring bridge is formed by a standard resistor RA, a variable resistor RB, and the resistance Rl of a loop comprising an auxiliary conductor AUX1 and the defective metal screen SCR, the screen being linked to the ground at a point Pd by a resistance Rd representing the insulation fault to be located. The bridge is supplied by a direct voltage E, generally in the order of 150 V, applied between the mid point A of resistors RA, RB and the ground, and comprising a balancing galvanometer G. At bridge balance, the electric resistance R1 that the screen SCR presents between its point of origin Po and the fault point Pd is given by the relation:

$$R1 = Rl\, RB/(RA+RB) \qquad (1)$$

In view of the linear resistance of the screen SCR, the distance L1 separating the point Pd from the point of origin Po is deduced.

This locating method and other similar methods derived from the Wheatstone bridge have various inconveniences. On the one hand, the method is based on a resistance measurement and requires a conversion of the result into a length, by means of a theoretical value of the linear resistance that can prove to be inaccurate. On the other hand, the accuracy of the measurement deteriorates when the resistance Rd of the insulation fault becomes high and must be offset by a significant increase in the power supply voltage E of the bridge, that can thus reach 500V. The application of a voltage E that high can lead to a breakdown of the cable insulating materials and represents a danger for the equipment connected to the network, thus requiring the latter to be temporarily put out of operation.

The voltage drop method, illustrated in FIG. 3, includes injecting a current i into the defective metal screen SCR by means of a current generator GA referenced to the ground. The current i circulates in a ground loop formed by the resistance R1 of the screen SCR between the point of origin Po and the fault point Pd, the resistance Rd of the fault, and the ground. The voltage drop V1 at the terminals of resistance R1 is measured by a voltmeter VM connected to the terminal point Pe of the screen by means of an auxiliary wire AUX1. A similar measurement is taken at the other end of the screen, to determine the voltage drop V2 at the terminals of resistance R2 of the screen between the fault point Pd and the terminal point Pe. As the length L of the screen is known, the relative position Pdr of the fault is deduced:

$$Pdr = L1/L = V1/(V1+V2) \qquad (2)$$

This method, like the previous one, has the disadvantage of requiring a high measuring voltage when the resistance Rd of the insulation fault is high. For example, the injection of a current of 4 mA requires the application of a voltage of 4KV when the resistance Rd is in the order of one Megohm.

2. Description of the Related Art

Moreover, the document E.C. BASCOM ET AL "Computerized Underground Cable Fault Location Expertise" presented at the conference "Proceedings of the Power Engineering Society Transmission and Distribution Conference, Chicago, Apr. 10–15, 1994" published IEEE review of Apr. 10, 1994, pages 376–382, reference XP000470557, describes on page 380, paragraph 10, a method for locating an insulation fault between a phase wire and the ground, including causing a current to circulate in the defective phase wire, by using a nondefective phase wire connected to one end of the defective- phase wire to form a conduction loop, and measuring the voltage at the two ends of the defective wire.

OBJECTS AND SUMMARY OF THE INVENTION

One object of the present invention is to provide a method for locating an insulation fault, relative to the ground, in the screen of an electric cable, which does not need a high measuring voltage, while being accurate.

Another object of the present invention is to provide a locating method that is accurate over a wide range of insulation fault values, particularly up to values in the order of one Megohm.

Yet another object of the present invention is to provide a locating method that is simple to use and that can be integrated into an automated maintenance system.

These objects, and others, are achieved by providing a method for locating an insulation fault in a conductor element relative to the ground, the conductor element being electrically accessible at least at one point of origin and at one terminal point, comprising steps of: injecting a current between the point of origin and the terminal point of the conductor element, by means of a current or voltage generator that is insulated from the ground; measuring a first electric voltage at the point of origin in reference to the ground; measuring a second electric voltage at the terminal point, the first and second voltages measured being linked by a relation that is representative of the relative position of the insulation fault between the point of origin and the terminal point.

In practice, the second voltage can be measured in relation to the point of origin or in reference to the ground.

According to one embodiment, the current or voltage generator is arranged at the point of origin of the conductor element and is connected to the terminal point of the conductor element by means of a first auxiliary wire. Also, the second voltage can be measured from the point of origin of the conductor element by means of a second auxiliary wire connected to the terminal point of the conductor element.

According to one embodiment, the current injected into the conductor element is a very low frequency alternating current, in the order of a tenth of a Hertz or less.

The present invention also relates to a method for locating an insulation fault comprising steps of: disconnecting the conductor element from the ground; injecting a low frequency current into the conductor element by means of a current or voltage generator referenced to the ground, so as to form a conduction loop passing by the insulation fault and the ground; detecting the current circulating in the conductor element by moving, along the conductor element, a contactless current detection device, until a current variation point is detected in the conductor element corresponding to the insulation fault sought.

Advantageously, the current injected into the conductor element comprises at least two currents of distinct frequencies, and the two currents are compared so as to determine the real part of the two currents that is independent from stray capacitances spread along the conductor element.

According to one embodiment, the conductor element comprises a metal screen of a telecommunication cable or several metal screens of telecommunication cables connected to each other.

The present invention also relates to a disconnection device relative to the ground of a metal screen of a telecommunication cable, comprising means for communicating with a piece of maintenance equipment by means of a pair of speech wires, means for carrying out screen connection or disconnection commands relative to the ground, and switch means to connect the screen to at least one auxiliary wire present in the telecommunication cable.

According to one embodiment, the device comprises means for disconnecting the communication means from the pair of speech wires, and for connecting the screen to at least one wire of the pair of speech wires, used as an auxiliary wire.

According to one embodiment, the device has means for measuring an electric voltage present on the metal screen.

According to one embodiment, the device comprises means for injecting a current into the metal screen.

The present invention also relates to a system for automatically locating an insulation fault, relative to the ground, in the metal screen of a cable comprising electric wires, comprising a current or voltage generator arranged at a point of origin of the screen, means for measuring an electric voltage, means for connecting the generator to the point of origin of the screen and to a first auxiliary wire present in the cable, means for connecting the measuring means to the point of origin of the screen and to the ground, and means for connecting the auxiliary wire to a terminal point of the screen.

According to one embodiment, the means for connecting the first auxiliary wire to a terminal point of the screen comprise a disconnection device according to the present invention, of the type described above.

According to one embodiment, the system comprises means for connecting the measuring means to the point of origin of the screen and to a second auxiliary wire present in the electric cable, and means for connecting the second auxiliary wire to the terminal point of the screen.

BRIEF DESCRIPTION OF THE DRAWINGS

These and other objects, advantages and features of the present invention shall be presented in greater detail in the following description of the method according to the present invention and of examples of devices used to implement the method, in conjunction with the following figures in which:

FIGS. 1A, 1B described above represent a telecommunication cable with an insulation fault, FIG. 2 described above illustrates a classical method for locating an insulation fault, FIG. 3 described above illustrates another classical method for locating an insulation fault, FIG. 4 represents a system for locating an insulation fault according to the present invention, and illustrates the method according to the present invention, FIG. 5 represents, in block form, a measuring device used in the locating method according to the present invention, FIG. 6 represents another embodiment of the locating system and method of FIG. 4.

DESCRIPTION OF THE PREFERRED EMBODIMENTS

Figure 7:
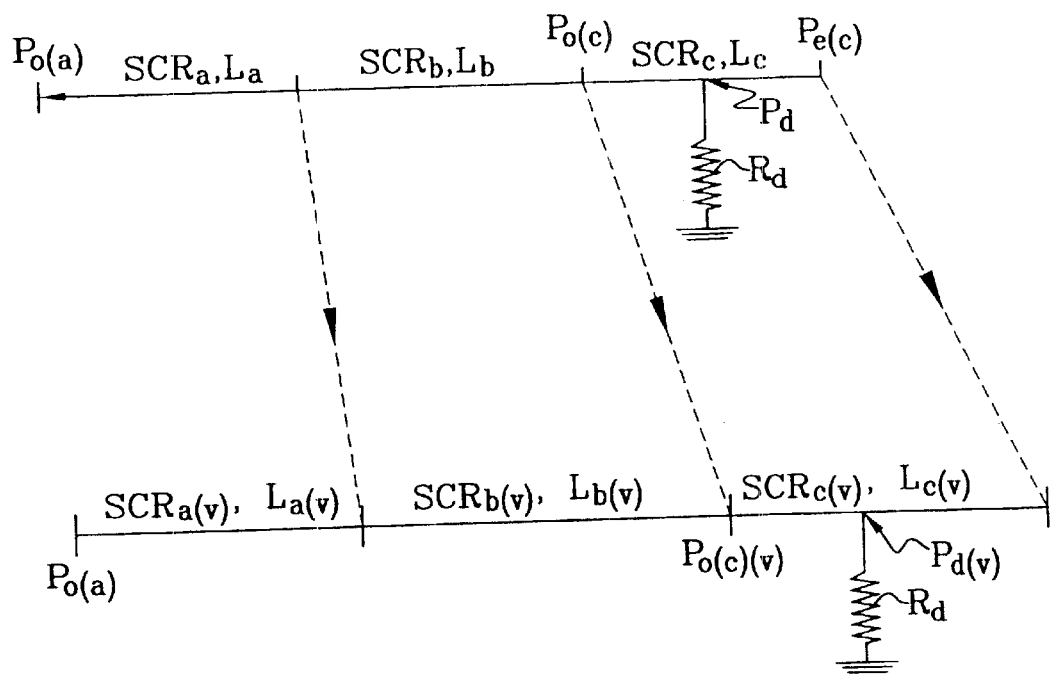
FIG. 7 illustrates an application of the method according to the present invention to locating an insulation fault in a network of cables comprising screens of different sections.

FIG. 4 represents a system 20 according to the present invention, allowing an insulation fault to be located that affects the metal screen SCR of a telecommunication cable. As indicated in the preamble, the insulation fault leads to a resistance Rd linking the screen to the ground at a point Pd to be determined.

The locating system 20 comprises two auxiliary wires AUX1, AUX2 chosen out of a set of speech wires present inside a cable (not represented), a current or voltage generator 21 insulated from the ground GND, a high input impedance device 22 for measuring a voltage and various switches I1 to I8. The generator 21 and the device 22 are arranged near the point of origin Po of the screen. The switches I1, I2 are provided to disconnect the point of origin Po and terminal point Pe of the screen SCR from the ground, and the switches I3 and I4 are provided to connect the generator 21 outputs to the auxiliary wire AUX1 and to the point of origin Po of the screen. The switches I5, I6 are provided to connect the auxiliary wires AUX1, AUX2 to the terminal point Pe of the screen, and switch I7 is provided to connect an input IN1 of the measuring device 22 to the point of origin Po of the screen. Finally, the switch I8 in position p1 allows the other input IN2 of the measuring device 22 to be connected to the ground and, in position p2, the input IN2 to be connected to the auxiliary wire AUX2.

Now, the fault point Pd, situated between the point of origin Po and the terminal point Pe will be located, as the length L of the screen is known.

To do this, the switches I1, I2 are open, the switches I3 to I7 are closed and the switch I8 is placed to position p1. The wire AUX1 and the screen SCR form a test loop connected to the generator 21. The wire AUX2 is connected to the terminal point Pe of the screen. According to the present invention, a current i is injected into the test loop and the voltage U1 present between the point of origin Po of the screen and the ground is measured. As the current i is maintained, the switch I8 is flipped to position p2 and a voltage U present between the point of origin Po and the terminal point Pe of the screen is measured. Once the measurement is taken, the cable is returned to its initial configuration: the switches I3 to I7 are open and the switches I1, I2 are closed.

As the voltage U1 is proportional to the distance L1 between the point Po and the fault point Pd, and the voltage U is proportional to the distance between the point Po and point Pe, i.e. the length L of the screen, the relative position Pdr of the fault in relation to the point of origin Po is deduced:

$$Pdr = U1/U = L1/L \quad (3)$$

The absolute position Pd of the fault, in relation to the point of origin Po is deduced:

$$Pd = L1 = L \; U1/U \quad (4)$$

As it will be clear to those skilled in the art, the method according to the present invention does not require the application of a high voltage, as the test loop is insulated from the ground at all points except at the fault point Pd. Thus, the current crossing the fault Rd is limited to a very low leakage current, sufficient to measure voltages U1, U yet negligible before the current i. As the electric resistance of the screen and of the auxiliary wire AUX1 does not generally exceed a few hundred ohms, a working voltage from 1 to 5V only is sufficient to obtain a current i in the test loop in the order of some tens of milliamperes.

In practice, a measurement of voltages U1, U in direct current can however prove to be tainted with errors due to the classic phenomenon of electrochemical couple.

To overcome this drawback, each voltage U1, U can be measured in two steps by means of two direct voltages of the same value but of opposite signs.

According to one idea of the present invention, another solution consists in measuring the voltages U1, U by means of a very low frequency alternating current i. The measurement in alternating current eliminates the electrochemical couple and by providing a very low frequency current it is possible to eliminate the influence of stray capacitances spread along the cable.

The applicant has conducted various tests to characterize the method according to the present invention with an alternating measuring current i, aiming to check the merits of this idea. Table 1 below summarizes the results of a first series of tests, the purpose of which was to determine, for a wide range of fault values Rd ranging from 0 Ω (bolted short) to 1 MΩ (insulation fault caused by the humidity before water penetrates into the cable), the maximum working frequency Fmax above which the accuracy of the method deteriorates and exceeds 1% in relative locating.

TABLE 1

| Value of the insulation fault and relative position on the screen | Fmax |
|---|---|
| Bolted short positioned at 42% | 1000 Hz |
| Bolted short positioned at 6% | 1000 Hz |
| 1 MΩ fault positioned at 42% | 1 Hz |
| 1 MΩ fault positioned at 6% | 100 mHz |

These tests confirm the advantage of a very low frequency measurement, particularly to locate a high value fault Rd, and show that the working frequency must preferably be lower than 100 mHz, 5 or 10 mHz for example.

Moreover, table 2 below summarizes the results of a second series of tests conducted with a frequency of 10 mHz, the purpose of which was to determine the influence of the position of fault Rd on the accuracy of the locating method according to the present invention.

TABLE 2

| Relative position of the fault along the cable | Limit value of the fault for locating with accuracy of at least 1% |
|---|---|
| Pdr = 6% | 1.5 MΩ |
| Pdr = 42% | 10 MΩ |
| Pdr = 94% | 1 MΩ |

Generally speaking, these tests show that the method according to the present invention allows insulation faults of up to 1 MΩ to be located with excellent accuracy, so that it is possible to locate and repair an insulation fault developing before water penetrates into the cable. Moreover, the measurement is taken by means of a low voltage that does not require the cable to be put out of operation, and the operation is therefore transparent to subscribers.

In addition, the aforementioned tests have shown the existence of broadband noise present in low frequencies, particularly in the preferential operating band of the method according to the present invention ranging from 5 to 100 mHz. In practice, these noises are barely perceptible in cases of bolted shorts (0 Ω) but become more significant when the fault resistance increases and nears the Megohm. Thus, according to another aspect of the present invention, the voltages U, U1 are measured by means of a synchronous detection amplifier or a digital signal processing system.

FIG. 5 represents an example of an embodiment of the measuring device 22 allowing the broadband noise mentioned above to be removed. The device 22 comprises a low-pass filter 210 at input that has a cut-off frequency of 1 Hz for example, that removes industrial noises of 50, 100 and 150 Hz. The filter output 210 is applied at the input of a sample-and-hold device 211, the voltage reference input REF of which is connected to the switch 18. The output of the sample-and-hold device 211 is applied to an analog/digital converter 212, the output of which is applied onto the input port of a microprocessor MP. The microprocessor MP is equipped with a classical signal processing algorithm, stored in a program memory MEM. Thus, the microprocessor MP reconstitutes a noiseless measuring signal and delivers the root-mean-square value or peak value of voltages U1 and U.

One embodiment of device 22 includes providing two signal acquisition chains arranged in parallel, the first one allowing the voltage U1 to be measured and the second the voltage U to be measured. In this case, the switch 18 with two positions is replaced by two simple switches, the voltages U1, U are measured simultaneously and the time required for the two measurements is divided by two. The time is in the order of one period of the work frequency, i.e. about one hundred seconds for a frequency of 10mHz.

It will be understood that the method according to the present invention is susceptible of different variations and applications. Thus, FIG. 6 represents an embodiment 30 on the locating system according to the present invention in which the auxiliary wire AUX2 is not used. Here, a second measuring device 31 is connected between the terminal point Pe of the screen SCR and the ground. The device 31 measures a voltage U2 between the point Pe and the ground and the device 22, connected between the point Po and the ground, measures the voltage U1 already described. In this case, the relative position Pdr of the insulation fault, in relation to the point of origin Po, is given by the following relation, equivalent to the relation (4) described above:

$$Pdr = U1/(U1+U2) \quad (5)$$

or by the relation:

$$Pdr = 1/(1+(U2/U1)), \quad (6)$$

or by any other equivalent relation.

Moreover, the method according to the present invention is applicable to the locating of an insulation fault in a cable network comprising several cables of different diameters, the screens of which do not have the same linear resistivity. As an example, FIG. 7 schematically represents a network comprising three cables in series of respective lengths La, Lb, Lc, comprising screens SCRa, SCRb, SCRc with linear resistivities Ra, Rb, Rc. It is assumed here that there is electric continuity between the screens and that they are only electrically accessible at the point of origin $PO_{(a)}$ of the screen SCRa and at the terminal point $Pe_{(c)}$ of the screen SCRc. In these conditions, the network is considered to comprise three virtual screens $SCRa_{(v)}$, $SCRb_{(v)}$, $SCRc_{(v)}$ having the same linear resistance, and virtual lengths $La_{(v)}$, $Lb_{(v)}$, $Lc_{(v)}$. The virtual length of each screen is calculated by multiplying its actual length by its linear resistance, and the result can be divided by a constant, the linear resistance Ra of the first screen SCRa, for example:

$$La_{(v)} = La\, Ra/Ra = La \quad (7)$$

$$Lb_{(v)} = Lb\, Rb/Ra \quad (8)$$

$$Lc_{(v)} = Lc\, Rc/Ra \quad (9)$$

The method according to the present invention is then used on the network in the way described above, so that a virtual position $Pd_{(a)(v)}$ of the insulation fault Rd is obtained in relation to the point of origin $Po_{(a)}$. Then, the virtual screen on which the fault is found is identified, and the virtual lengths of the previous screens are subtracted from the virtual position $Pd_{(a)(v)}$, for example the lengths $La_{(v)}$, $Lb_{(v)}$ in the example of FIG. 7. Thus, the virtual position $Pd_{(c)(v)}$ of the fault in relation to the point of origin $Po_{(c)(v)}$ of the third virtual screen $SCRc_{(v)}$ is obtained. The real position $Pd_{(c)}$ of the fault in relation to the point of origin $Po_{(c)}$ of the third screen is deduced:

$$Pd_{(c)} = Pd_{(c)(v)}\, Ra/Rc \quad (10)$$

Finally, the method according to the present invention allows high value insulation faults to be located with an accuracy of at least 1%, on very long cables, with a low alternating measuring voltage that is outside the voice band (300–3000 Hz). Furthermore, the method is easy and quick to implement, the results obtained are particularly easy to interpret and do not require the use of calculation charts or corrective terms. In addition, the method is not sensitive to the interference contact resistances linked to the connection of measuring devices. Finally, the method can easily be integrated into an automated maintenance system, as explained below.

Figure 8:
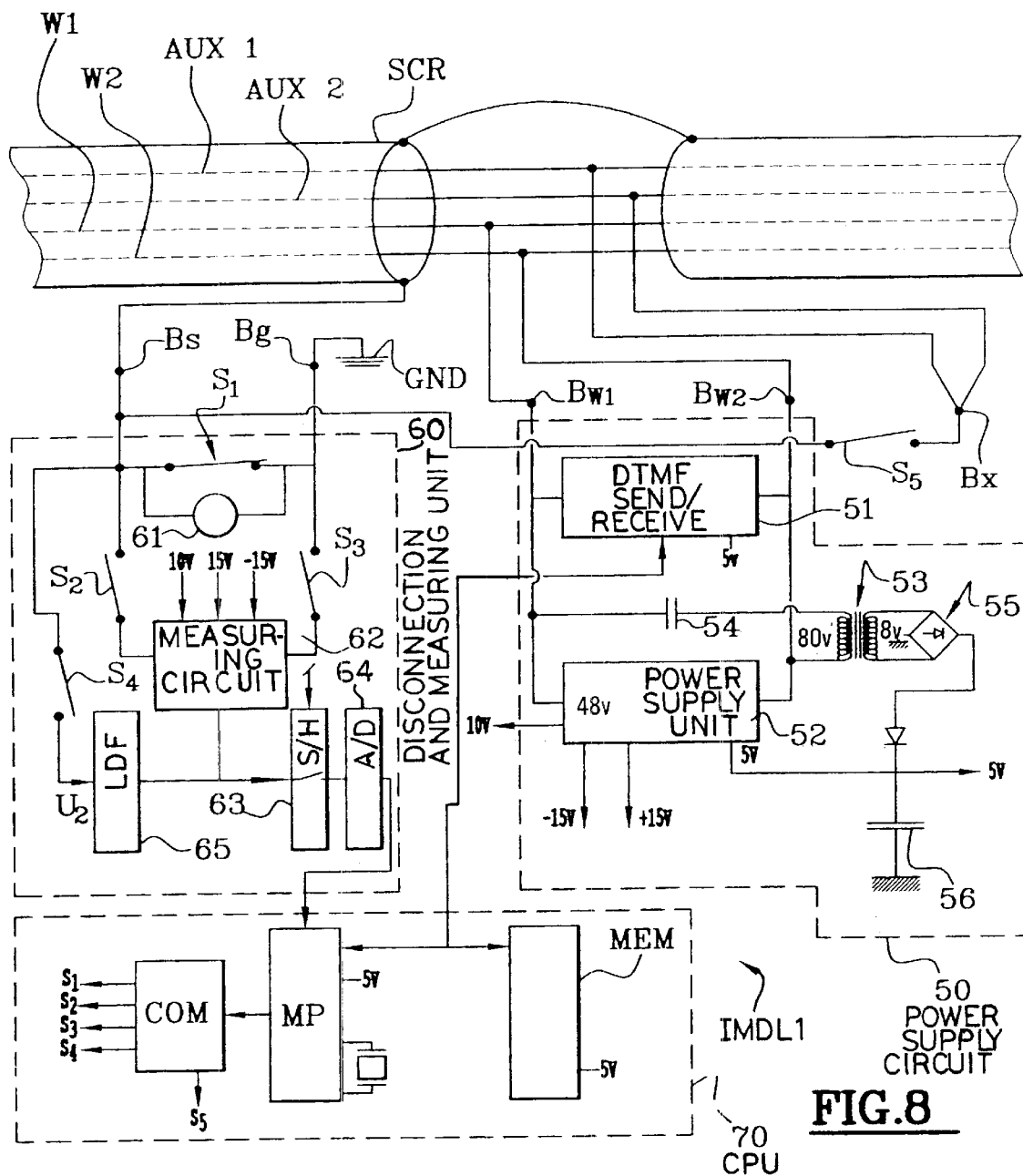
FIG. 8 represents a disconnection and measuring device according to the present invention.

FIG. 8 represents the wiring diagram of a disconnection and measuring device IMDL1 according to the present invention, that can be remotely controlled. The device IMDL1, connected to the metal screen SCR of a telecommunication cable and to a pair of speech wires W1, W2 and two auxiliary wires AUX1, AUX2 present in the cable, is provided to carry out several functions:

i) disconnecting the metal screen SCR relative to the ground GND, ii) measuring the insulation resistance and the electrochemical couple between the screen SCR and the ground GND, iii) connecting the auxiliary wires AUX1, AUX2 to the screen SCR to implement the method according to the present invention, function ii) being independent of function iii) and optional with regard to the present invention.

For this purpose, the device IMDL1 has five terminals Bs, Bg, Bw1, Bw2, Bx, a telecommunication and electric power supply circuit 50, connected to terminals Bw1, Bw2, a disconnection and measuring circuit 60, connected to terminals Bs, Bg, and a central processing unit 70 connected to circuits 50, 60.

The circuit 50 comprises a classical DTMF ("Dual Tone Multi-Frequency") send-receive circuit 51, a power supply unit 52 and a 80V/8V transformer 53 with high output current connected to one of terminals Bw1, Bw2 by means of a capacitor 54. The power supply unit 52 comprises various regulators, delivers voltages of 5V, ±15V and a reference voltage of 10V. The output of transformer 53 is applied to a rectifier circuit 55, the output of which loads a capacitor 56 forming a reservoir of power for the supply voltage of 5V.

The central processing unit 70 comprises a microprocessor MP fitted with a program memory MEM, and a switch pilot circuit COM.

The circuit 60 comprises a switch S1 that is normally off when there is no electric power supply, a relay for example, connected between terminals Bs, Bg and protected by a surge suppressor 61. The circuit 60 also comprises a measuring circuit 62 connected to terminals Bs, Bg by means of switches S2, S3. The output of the circuit 62 is applied to a sampler circuit 63 followed by an A/D converter 64, the output of which is sent to the microprocessor MP. The circuit 62 comprises means for measuring an insulation resistance and/or an electrochemical couple between terminals Bs, Bg. These means, that are classical per se and the operating principle of which is described in Patent EP 408 480, use the 10V reference voltage delivered by the unit 52 and an inverse voltage of −10V delivered by internal operational amplifiers (not shown) powered with ±15V.

Finally, the terminal Bx is connected to terminal Bs by means of a switch S5.

When the device IMDL1 is in operation, the terminal Bs is connected to the metal screen SCR, the terminal Bg is connected to the ground, the terminals Bw1, Bw2 are connected to the pair of speech wires W1, W2 and the terminal Bx is connected to the auxiliary wires AUX1, AUX2. Classically, the pair of wires W1, W2 conveys a direct supply voltage of 48V and allows efficient ringing pulses of 80V and DTMF pulses of a few Volts to be transmitted.

It will now be assumed that several IMDL1 devices are connected at different points on the telecommunication cable and are all connected, by means of the pair of speech wires W1, W2, to a piece of maintenance equipment arranged in a telephone exchange for example. When ringing pulses are sent, the insulation capacitor 54 goes into a transmitting state, the transformer 53 supplies the rectifier 55 which rapidly loads the capacitor 56. As the electric power sent on the network by means of the direct voltage of 48V is insufficient to supply several devices IMDL1 simultaneously, the precharge of the capacitor 56 during the ringing tone allows them to accumulate sufficient power to receive and analyze a selection code sent by the maintenance equipment in the form of coded DTMF pulses. When this code is received, the selected device IMDL1 is powered by the 48V voltage on the line and remains awaiting a command, received in the form of a series of DTMF pulses. The other devices IMDL1 go into a dormant state in which they hardly consume any power.

The command received by the selected device IMDL1 can be a command to open the switch S1 and to measure the insulation resistance or an electrochemical couple, performed by circuit 62. The result of the measurement is digitized and sent back by the microprocessor to the maintenance equipment, in DTMF coded form.

According to the present invention, the device IMDL1 is also provided to perform a command to open switch S1 and to close switch S5. In this case, the wires AUX1, AUX2 are connected to the screen SCR. The method according to the present invention can then be used from any point of origin Po, by applying a low frequency voltage to the point of origin Po and by measuring voltages U, U1 already described. In this case, the other devices IMDL1 connected to the screen SCR are first selected one after the other to receive a command to open switch S1, in order to disconnect all the points of voluntary connection of the screen to the ground.

According to a first embodiment of the device IMDL1, the measuring circuit 60 comprises a low-pass filter 65 connected to terminal Bs by means of a switch S4, and the output of filter 65 is applied to the input of the sampler 63. A signal processing algorithm is loaded into the memory MEM of the microprocessor and the device IMDL1 is arranged to perform a measuring command of the voltage U2 described above in relation with FIG. 6. In this case, the voltage U2 present on the terminal Bs is filtered by the filter 65, sampled and digitalized by circuits 63, 64 then analyzed by the microprocessor MP. As above, the result of the measurement is sent to the maintenance equipment. Here, the auxiliary wire AUX2 allowing the voltage U to be measured from a point of origin is not required.

According to a second embodiment, the device IMDL1 comprises the low frequency generator 21 described above and means for measuring voltages U1, U or the voltage U1 only. As in the first embodiment, these means are formed by the acquisition and measuring chain comprising the filter 65, the sampler 63, the converter 64 and the microprocessor MP. Switches arranged in a manner that is within the understanding of those skilled in the art are provided to ensure the various connections of the generator 21 and of the measuring chain to the screen SCR, to the ground GND, to the auxiliary wires AUX1, AUX2 or to the auxiliary wire AUX1 only. Thus, an "origin" type device $IMDL1_{OR}$ is achieved, allowing a point of origin Po of current injection to be defined to implement the method according to the present invention.

It will be understood that it is also possible to provide a device $IMDL1_{OR}$ comprising a generator capable of delivering two direct voltages of opposite signs and means for measuring voltages U1, U in direct current according to the dual measurement principle mentioned above. Equally, a "terminal" type device IMDL1 may include means of measuring the voltage U2 according to this principle.

Figure 9:
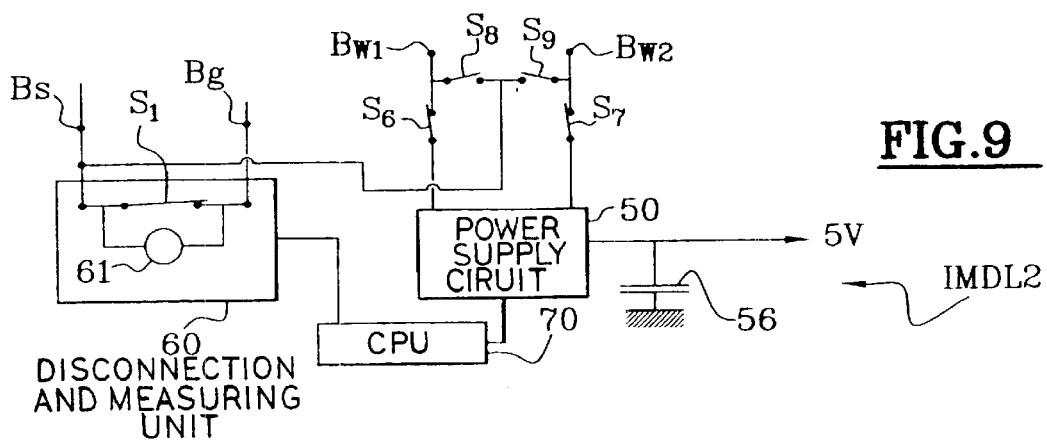
FIG. 9 illustrates an embodiment of the disconnection device of FIG. 8.

FIG. 9 represents another embodiment IMDL2 of the disconnection device described above. Here, the idea of the present invention is to use the wires W1, W2 as auxiliary wires AUX1, AUX2 to implement the locating method. Therefore, the terminal Bx is removed. The circuit 50 is connected to terminals Bw1, Bw2 by means of two switches S6, S7 and the terminal Bs is connected to terminals Bw1, Bw2 by means of two other switches S8, S9. The switches S6, S7 are open and the switches S8, S9 are closed during the measuring periods of voltages U1, U from a point of origin Po. During these periods, the device IMDL2 can no longer communicate with the maintenance equipment. A delay is provided to reestablish the communication once the measurements have been taken. The capacitor 56 is preferably a high value electrochemical capacitor, allowing a sufficient amount of electricity to be accumulated to keep the switches S8, S9 closed during the delay.

As the device IMDL2 only differs from device IMDL1 by a different switch arrangement, it is clear that the first and second embodiments described above are applicable to this device. In particular, according to the present invention, a device $IMDL2_{OR}$ of the "origin" type can be achieved that comprises a low voltage generator and means for measuring voltages U1, U or the voltage U only.

In practice, the combination of various devices IMDL1 or IMDL2 of the "terminal" type and $IMDL1_{OR}$ or $IMDL2_{OR}$ of the "origin" type in a network of telecommunication cables, enables the locating method to be integrated into a fully automated maintenance system. Each device IMDL1, IMDL2 is capable of disconnecting the metal screen of a cable from the ground, of measuring the insulation resistance of the screen and/or the electrochemical couple, or of connecting the screen to the pairs of wires AUX1/AUX2 or W1/W2 (or wire AUX1 or W1 only, with measurement of voltage U2). Furthermore, each device $IMDL_{OR}$ is capable of disconnecting the metal screen of a cable from the ground, of measuring the insulation resistance of the screen and/or the electrochemical couple, of sending a low frequency current in the cable, of measuring voltages U1 and U (or the voltage U1 only, with measurement of the voltage U2 by a device IMDL1, IMDL2). The measurements of the insulation resistance are taken daily, for several minutes. The results of measurements, received by the local maintenance equipment, are sent to a regional maintenance center for processing and analysis of the state of the network. If an anomaly is detected, the locating method according to the present invention is used.

Thus, using the present invention it is possible to check the condition of a telecommunication cable or of a network of cables automatically and recurrently, to detect the occurrence of an insulation fault and to locate the fault before it extends to the speech wires themselves. The present invention is also applicable to any type of cable, particularly electricity supply cables. More generally speaking, the present invention is applicable to the detection of an insulation fault between all types of conductors.

Furthermore, it emerges from the above that the terms "origin" and "terminal" must not be interpreted restrictively as meaning the point of origin and the end point of a cable. Generally speaking, these terms mean points of electric connection with a metal screen between which the locating method according to the present invention is implemented.

Figure 10:
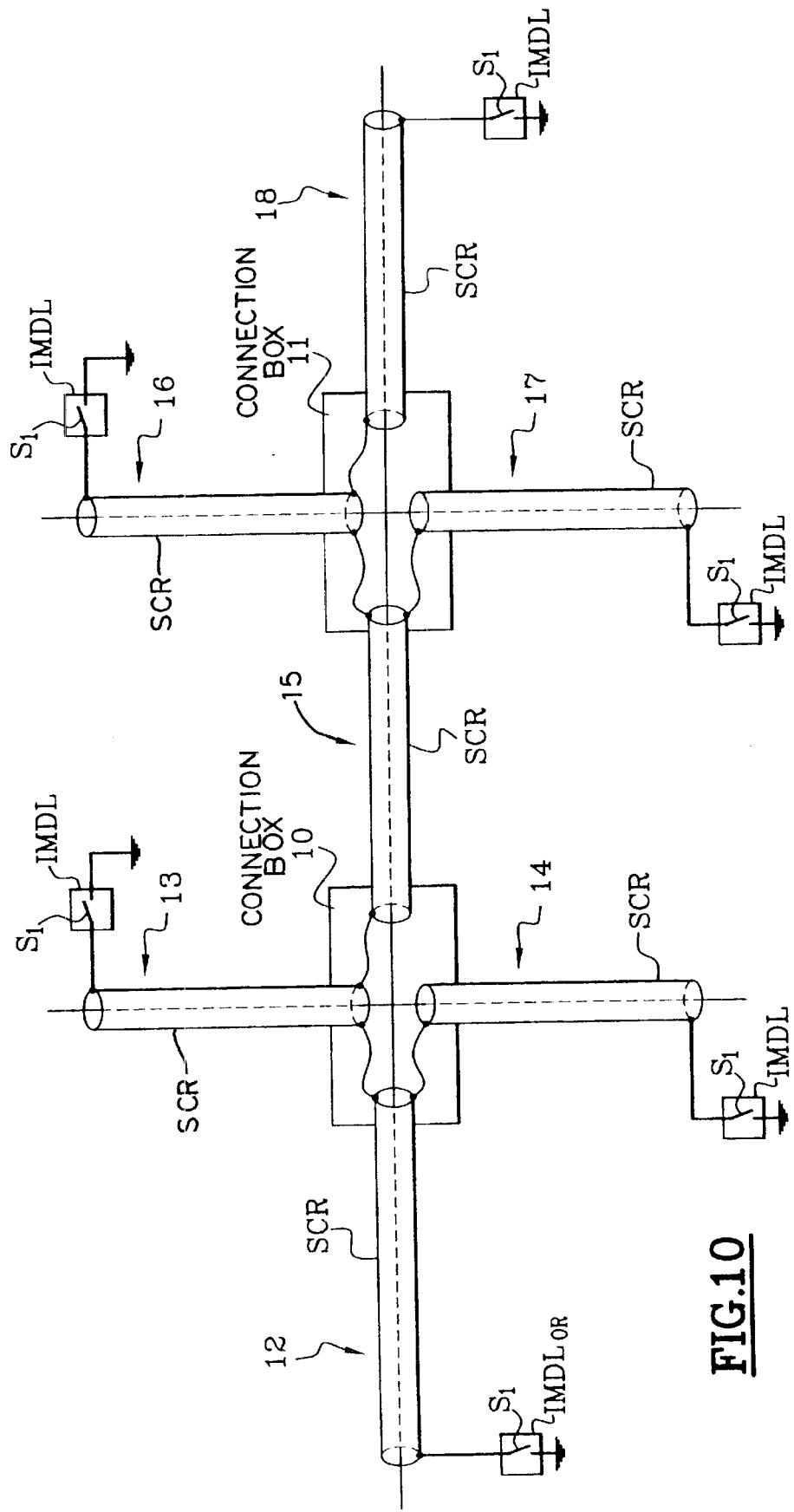
FIG. 10 represents a network of telecommunication cables equipped with a plurality of devices according to FIG. 9.

Finally, as schematically shown in FIG. 10, the present invention also enables insulation faults occurring in connection boxes 10, 11 of cables 12, 13, 14, 15, 16, 17, 18 to be located, as these boxes do sometimes have sealing problems. According to one maintenance configuration that is particularly simple and represented in FIG. 10, a device IMDL$_{OR}$ is arranged at the point of origin of cable 12 and devices IMDL at the end points of the cable network, here the ends of cables 13, 14, 16, 17, 18. It will be understood that other devices IMDL can be arranged at other points of the cable network at each input and output of connection boxes 10, 11 for example.

Figure 11:
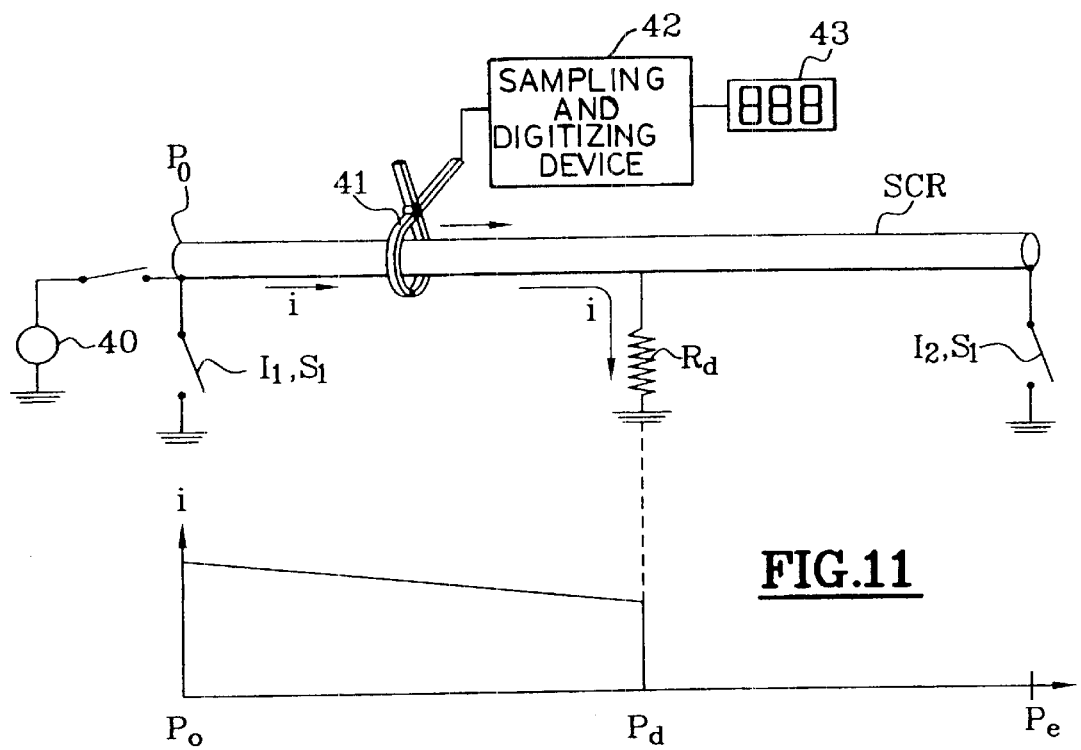
FIG. 11 illustrates a second method for locating an insulation fault according to the present invention.

In connection with FIG. 11 a second locating method according to the present invention will now be described with which it is possible to determine, with great accuracy, the location of an insulation fault. It is assumed, for example, that a fault has been located with an accuracy of 1% on a cable that is 1000 m long by means of the method described above. One suspect portion of cable that is 10 m long is thus determined. After disconnecting the metal screen SCR from the ground, an alternating current i is injected by means of a generator 40 referenced to the ground. Thus a ground loop is achieved that passes via the resistance Rd of the fault. By means of a clip-on ammeter 41, that is classical per se and equipped with a sensor that is sensitive to electromagnetic fields, the current i circulating in the screen can be observed. The ammeter 41 is moved along the cable. At the location of the insulation fault, the current i is diverted in the ground by the resistance Rd of the fault and is no longer detected, as shown in the diagram in FIG. 11. At that moment, the insulation fault has been found and the cable can be repaired.

Figure 12:
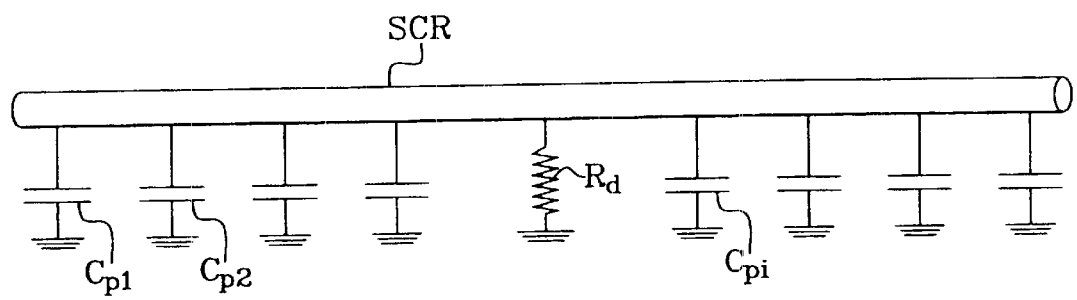
FIG. 12 represents capacitances spread along a cable.

According to the present invention, the alternating current i sent in the screen SCR is a low frequency current in the order of 1 Hz to a few Hertz comprising at least two oscillation frequencies, a frequency of 1 Hz and a frequency of 10 Hz for example. The signal delivered by the sensor of the clip-on ammeter 41 is sent to a device 42, equipped with a display device 43, that samples and digitally processes the signal. Thus, the current i comprises at least two superimposed currents i1, i2 of different frequencies. The processing performed by the device 42 includes analyzing the signal delivered by the electromagnetic sensor, for example by means of a fast Fourier transform algorithm FFT, to extract the two currents i1, i2, then to compare the two currents progressively as the clip-on ammeter is moved along the cable. This method enables the influence of stray capacitances Cp1, Cp2, . . . Cp$_i$ spread along the cable to be removed. These capacitances are represented in FIG. 12 and form leakage impedances in parallel with the resistance Rd that can attain values in the order of one Megohm depending on the frequency of the current i. These stray capacitances Cp$_i$ divide up the passage of the current i in the ground and disturb the locating of the insulation fault, particularly when the resistance Rd of the fault is high.

More particularly, the measurement of modules |i1|, |i2| of the two currents i1, i2 allows a system of two equations with two unknown quantities to be established with which it is possible to determine the real part ir of currents i1, i2, that is identical for both currents and only depends on the resistance Rd, the resolution of the system of equations leading to the following relation:

$$ir = \sqrt{((\omega_1^2|i_2|^2 - \omega_2^2|i_1|^2)/(\omega_1^2 - \omega_2^2))} \quad (11)$$

$\omega_1$ and $\omega_2$ being the respective pulses of currents i1, i2.

Therefore, the provision of at least two superimposed working frequencies and the comparison of the two currents i1, i2 make it possible to conduct a sort of digital filtering of the influence of stray capacitances Cp$_i$ by removing the imaginary components of the two currents that are a function of these capacities, and allow the fault point Rd to be accurately located.

Figure 13:
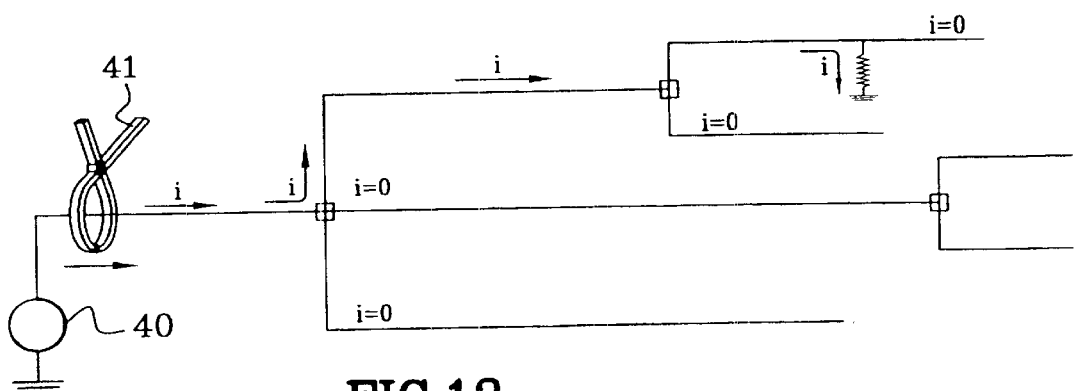
FIG. 13 illustrates one application of the second method to locating an insulation fault in a tree structure cable network.

This second method according to the present invention is therefore, by nature, distinct and independent from the method described above. It can be implemented independently from the first method or as an additional method. In particular, it would be possible to consider testing a cable over its whole length using the clip-on ammeter without first having to locate the suspect portion of the cable. For example, as shown in the diagram in FIG. 13, this second method allows an insulation fault Rd to be detected in a tree network of cables, by "following", strictly speaking, the leakage current i using the clip-on ammeter 41 from the point of origin of the network, the current i being zero in the sound branches of the network.

In practice, the disconnection of the screen or screens from a network of cables comprising an insulation fault Rd can be done by means of devices IMDL of the "terminal" or "origin" type. Similarly, the generator 40 referenced to the ground can be the generator present in a device IMDL$_{OR}$.

What is claimed is:

1. A method for locating an insulation fault (Rd), relative to the ground (GND), in the screen (SCR) of a cable, the cable including an auxiliary wire (AUX1, W1), the screen being electrically accessible at least at one point of origin (Po) and at one terminal point (Pe), the method comprising the steps of:

disconnecting the screen (SCR) from the ground, at the point of origin (Po) and the terminal point (Pe) of the screen and any other points of voluntary connection of the screen (SCR) to the ground, connecting the terminal point (Pe) of the screen to the auxiliary wire (AUX1, W1) present in the cable, injecting a current between the point of origin (Po) and the terminal point (Pe) of the screen (SCR), by means of a current or voltage generator (21) that is insulated from the ground, using the auxiliary wire (AUX1, W1) to connect the current or voltage generator (21) to the terminal point (Pe) of the screen, measuring a first electric voltage (U1) at the point of origin (Po) in reference to the ground, and measuring a second electric voltage (U, U2) at the terminal point (Pe), the first (U1) and the second (U, U2)

voltages measured being linked by a relation that is representative of the relative position (Pdr) of the insulation fault between the point of origin (Po) and the terminal point (Pe).

2. The method according to claim 1, in which the second voltage (U) is measured in relation to the point of origin (Po), the relative position Pdr of the insulation fault being given by the relation:

$$Pdr=U1/U$$

or any other equivalent relation, "U1" meaning the first voltage measured and "U" the second voltage measured.

3. The method according to claim 2, further comprising the following steps:
connecting the terminal point (Pe) of the screen to a second wire (AUX2, W2) present in the cable,
measuring the second voltage (U, U2) from the point of origin (Po) of the screen (SCR) by means of the second auxiliary wire (AUX2, W2) connected to the terminal point (Pe) of the screen.

4. The method according to claim 1, in which the second voltage (U2) is measured in reference to the ground, the relative position Pdr of the insulation fault being given by the relation:

$$Pdr=U1/(U1+U2)$$

or any other equivalent relation, "U1" meaning the first voltage measured and "U2" the second voltage measured.

5. The method according to claim 1, in which the current injected into the screen is an alternating current of very low frequency, on the order of a tenth of a Hertz or less.

6. The method according to claim 1, in which at least the terminal point (Pe) of the screen is disconnected from the ground by means of a disconnection device (IMDL1, IMDL2) remotely controlled by means of a pair of electric wires (W1, W2).

7. The method according to claim 6, in which a first wire (W1) of the abovementioned pair of electric wires is used as the first auxiliary wire (AUX1) to connect the current or voltage generator (21) to the terminal point (Pe) of the screen, switch means (S8) being provided in the disconnection device (IMDL2) to connect the aforementioned first wire (W1) to the terminal point (Pe) of the screen (SCR).

8. The method according to claim 7, in which the second wire (W2) of the above-mentioned pair of electric wires is used as the second auxiliary wire (AUX2) to measure the second voltage (U, U2), switch means (S9) being provided in the disconnection device (IMDL2) to connect the aforementioned second wire (W2) to the terminal point (Pe) of the screen (SCR).

9. A method for locating an insulation fault (Rd), relative to the ground (GND), in the screen (SCR) of a cable, the screen being electrically accessible at least at one point of origin (Po) and at one terminal point (Pe), the method comprising the steps of:
disconnecting the screen (SCR) from the ground, at the point of origin (Po) and the terminal point (Pe) of the screen and any other points of voluntary connection of the screen (SCR) to the ground,
injecting a low frequency current between the point of origin (Po) and the terminal point (Pe) of the screen (SCR), by means of a current or voltage generator (40) referenced to the ground so as to form a conduction loop passing by the insulation fault and the ground,
measuring a first electric voltage (U1) at the point of origin (Po) in reference to the ground,
measuring a second electric voltage (U, U2) at the terminal point (Pe), the first (U1) and the second (U, U2) voltages measured being linked by a relation that is representative of the relative position (Pdr) of the insulation fault between the point of origin (Po) and the terminal point (Pe), and
detecting the current circulating in the screen by moving a contactless current detection device (41) along the screen, until a current variation point (Pd) is detected in the screen corresponding to the insulation fault (Rd) sought.

10. The method according to claim 9, in which the current (i) injected into the screen (SCR) comprises at least two currents (i1, i2) of distinct frequencies, and in which the two currents (i1, i2) are measured so as to determine the real part of the two currents that is independent from stray capacitances ($Cp_i$) along the screen.

11. The method according to claim 1, in which the screen (SCR) comprises a metal screen of a telecommunication cable or several metal screens of telecommunication cables connected to each other.

12. An automatic system for locating an insulation fault, relative to the ground, in the metal screen of a telecommunication cable, the screen having a point of origin (Po) and a terminal point (Pe), the system comprising:
a disconnection and measuring device (IMDL1, IMDL2, IMDL1$_{or}$, IMDL2$_{or}$) located at a point selected from the point of origin and the terminal point, the device comprising:
means (51, MP, MEM) for communicating with remote maintenance equipment using a pair of speech wires (W1, W2) present in the telecommunication cable; and
means (60, S1, MP, MEM, COM) for carrying out commands from the remote maintenance equipment, in order to connect and disconnect the screen from the ground at the selected point, and switch means (S5, S8, S9) to connect at least one auxiliary wire present in the telecommunication cable to the selected point,
the system further including,
means (21) for injecting a current into the metal screen using the auxiliary wire when the screen is disconnected from the ground, and
means for measuring (63, 64, 65, MP, MEM) the voltage at the point of origin and at the terminal point and relating the measured voltages to the location of the insulation fault.

13. The automatic system according to claim 12, further comprising means (S6, S7, S8, S9) for disconnecting the communication means (50) from the pair of speech wires (W1, W2), and for connecting the screen to at least one wire of the pair of speech wires (W1, W2), to be used as the auxiliary wire.

14. A system for locating an insulation fault, relative to the ground, in the metal screen of a cable including electric wires, the metal screen including a point of origin and a terminal point, the system comprising:
means (I1, I2, IMDL) for disconnecting the screen from the ground at any points of voluntary connection of the screen to the ground,
a current or voltage generator (21) insulated from the ground for injecting a current between the point of origin and the terminal point when the screen is disconnected from the ground,
means (I3, I4, IMDL1$_{or}$, IMDL2$_{or}$) for connecting the generator (21) to the point of origin of the screen and to a first auxiliary wire present in the cable, means (I5, IMDL1, IMDL2) for connecting the first auxiliary wire to the terminal point of the screen, means (22) for measuring an electric voltage at the point of origin with reference to the ground, and means (I7, I8, IMDL1$_{or}$, IMDL2$_{or}$) for connecting the measuring means to the point of origin of the screen and to the ground.

15. The system according to claim 14, wherein the means for connecting the first auxiliary wire to the terminal point includes:

a disconnection device (IMDL1, IMDL2) located at the terminal point, comprising, means (51, MP, MEM) for communicating with remote maintenance equipment using a pair of speech wires (W1, W2) present in the cable; and means (60, S1, MP, MEM, COM) for carrying out commands from the remote maintenance equipment, in order to connect and disconnect the screen from the ground at the terminal point, and switch means (S5, S8, S9) to connect the auxiliary wire to the terminal point.

16. The system according to claim 14 further comprising means (I7, I8, IMDL1$_{or}$) IMDL2$_{or}$) for connecting the measuring means (22) to the point of origin and to a second auxiliary wire present in the cable, and means (I6, IMDL1, IMDL2) for connecting the second auxiliary wire to the terminal point of the screen.

* * * * *